US012685230B2

(12) United States Patent
Yoshida et al.

(10) Patent No.: US 12,685,230 B2
(45) Date of Patent: Jul. 14, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Satoshi Yoshida, Kawasaki (JP); Tatsunori Sakano, Tokyo (JP); Ryohei Gejo, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 417 days.

(21) Appl. No.: 18/455,946

(22) Filed: Aug. 25, 2023

(65) Prior Publication Data

US 2024/0297153 A1      Sep. 5, 2024

(30)      Foreign Application Priority Data

Mar. 1, 2023     (JP) ................................. 2023-031319

(51) Int. Cl.
*H10W 90/00*          (2026.01)
*H10W 90/10*          (2026.01)
(52) U.S. Cl.
CPC ............ *H10W 90/00* (2026.01); *H10W 90/10* (2026.01)
(58) Field of Classification Search
CPC ................... H01L 25/072; H01L 24/24; H01L 2224/24137; H01L 2924/30107; H01L 23/5283; H01L 23/5226; H10W 90/00; H10W 90/10; H10W 70/60; H10W 20/435; H10W 20/42
See application file for complete search history.

(56)          References Cited

U.S. PATENT DOCUMENTS

2002/0154482 A1    10/2002  Miyake et al.
2004/0021149 A1*   2/2004   Kitazawa .............. H01L 25/072
                                                       257/E23.101
(Continued)

FOREIGN PATENT DOCUMENTS

JP          2002-208542 A      7/2002
JP          2002-222916 A      8/2002
JP          2016-219521 A     12/2016

*Primary Examiner* — Galina G Yushina
(74) *Attorney, Agent, or Firm* — Maier & Maier, PLLC

(57)          ABSTRACT
A semiconductor chip includes a semiconductor layer, a first electrode located between a first conductive member and the semiconductor layer, a first gate pad located between the first conductive member and the semiconductor layer, a second gate pad located between the first conductive member and the semiconductor layer, and a second electrode located between the semiconductor layer and a second conductive member. A plurality of terminals includes a first gate terminal electrically connected to the first gate pad via the interconnection member, a second gate terminal electrically connected to the second gate pad via the interconnection member, and a sense terminal electrically connected to the first conductive member via the interconnection member. The sense terminal is located between the first gate terminal and the second gate terminal in a plan view perpendicular to a first direction.

11 Claims, 10 Drawing Sheets

(56) References Cited

U.S. PATENT DOCUMENTS

| | | | |
|---|---|---|---|
| 2018/0182694 A1* | 6/2018 | Soyano | H01L 23/3735 |
| 2019/0244888 A1* | 8/2019 | Kawashima | H01L 23/49822 |
| 2020/0105677 A1* | 4/2020 | Chiba | H01L 23/5386 |
| 2020/0328146 A1* | 10/2020 | Kajiwara | H01L 23/3192 |
| 2022/0020669 A1* | 1/2022 | Mcknight-Macneil | |
| | | | H01L 23/4824 |
| 2022/0406690 A1* | 12/2022 | Hori | H01L 24/73 |
| 2024/0162122 A1* | 5/2024 | Egusa | H01L 23/36 |

* cited by examiner

SEMICONDUCTOR DEVICE

CROSS-REFERENCE TO RELATED APPLICATION

This application is based upon and claims the benefit of priority from Japanese Patent Application No. 2023-031319, filed on Mar. 1, 2023; the entire contents of which are incorporated herein by reference.

FIELD

Embodiments described herein relate generally to a semiconductor device.

BACKGROUND

An insulated gate bipolar transistor (IGBT) is widely used as a power semiconductor device that controls a large breakdown voltage and a large current. The IGBT used as a switching element is desired to have a low on-voltage and a low switching loss. As a method for reducing the turn-off loss while maintaining the on-voltage low, there has been proposed a double gate structure in which gate electrodes are separately formed in two systems and one of the gate electrodes is turned off first.

DETAILED DESCRIPTION

Figure 1:
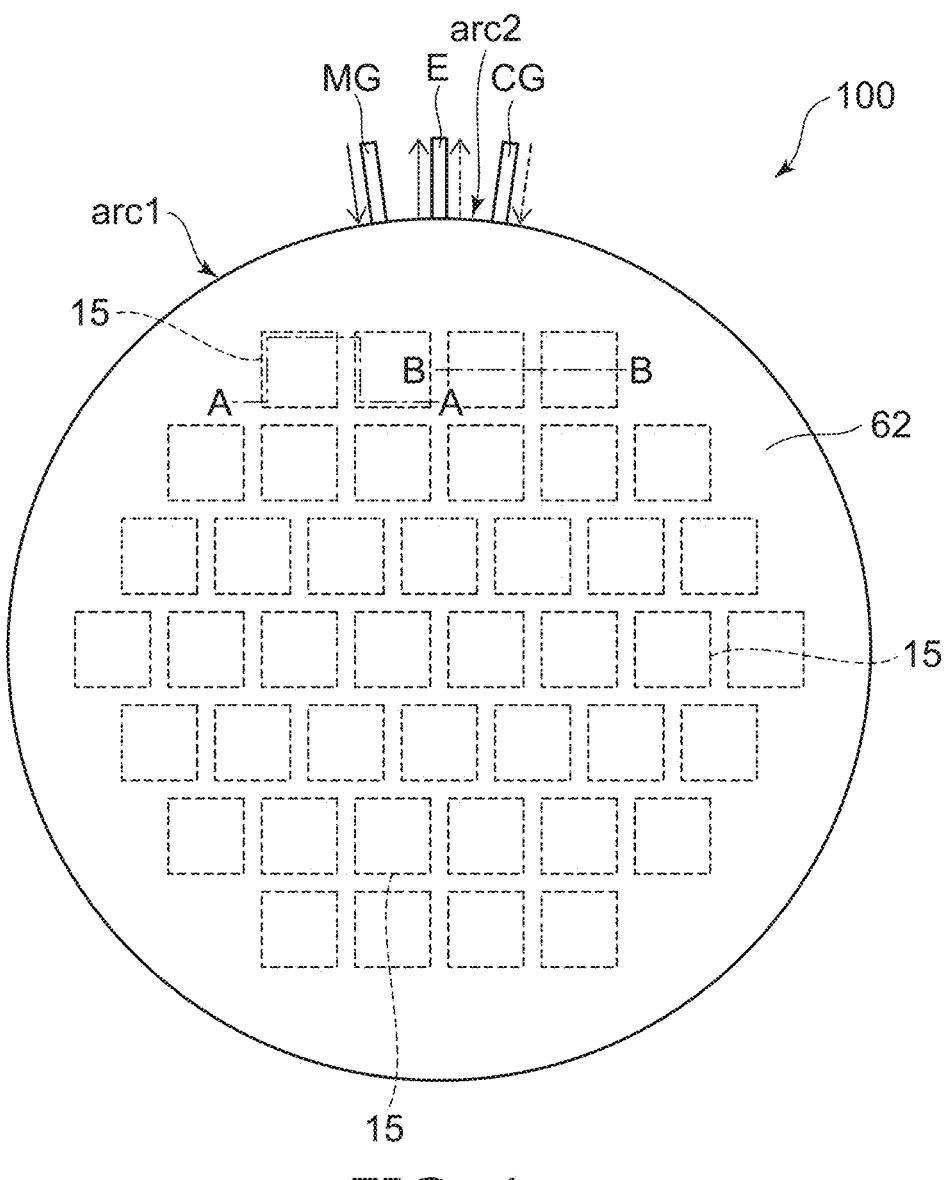
FIG. 1 is a schematic plan view of a semiconductor device of a first embodiment.

According to one embodiment, a semiconductor device includes a first conductive member; a second conductive member; an interconnection member located between the first conductive member and the second conductive member; a plurality of semiconductor chips located between the second conductive member and the interconnection member in a first direction from the first conductive member to the second conductive member; and a plurality of terminals extending from the interconnection member in a direction intersecting the first direction, the semiconductor chip including a semiconductor layer, a first electrode located between the first conductive member and the semiconductor layer and electrically connected to the first conductive member, a first gate pad located between the first conductive member and the semiconductor layer, a second gate pad located between the first conductive member and the semiconductor layer, and a second electrode located between the semiconductor layer and the second conductive member and electrically connected to the second conductive member, the plurality of terminals include a first gate terminal electrically connected to the first gate pad via the interconnection member, a second gate terminal electrically connected to the second gate pad via the interconnection member, and a sense terminal electrically connected to the first conductive member via the interconnection member, and the sense terminal is located between the first gate terminal and the second gate terminal in a plan view perpendicular to the first direction.

Hereinafter, embodiments will be described with reference to the drawings.

The drawings are schematic or conceptual. A relationship between a thickness and a width of each portion, a ratio of sizes between portions, and the like are not necessarily the same as the actual ones. Even if same portions are shown, dimensions and ratios may be shown differently from each other in the drawings.

The same or similar components are denoted by the same reference signs.

First Embodiment

Figure 2:
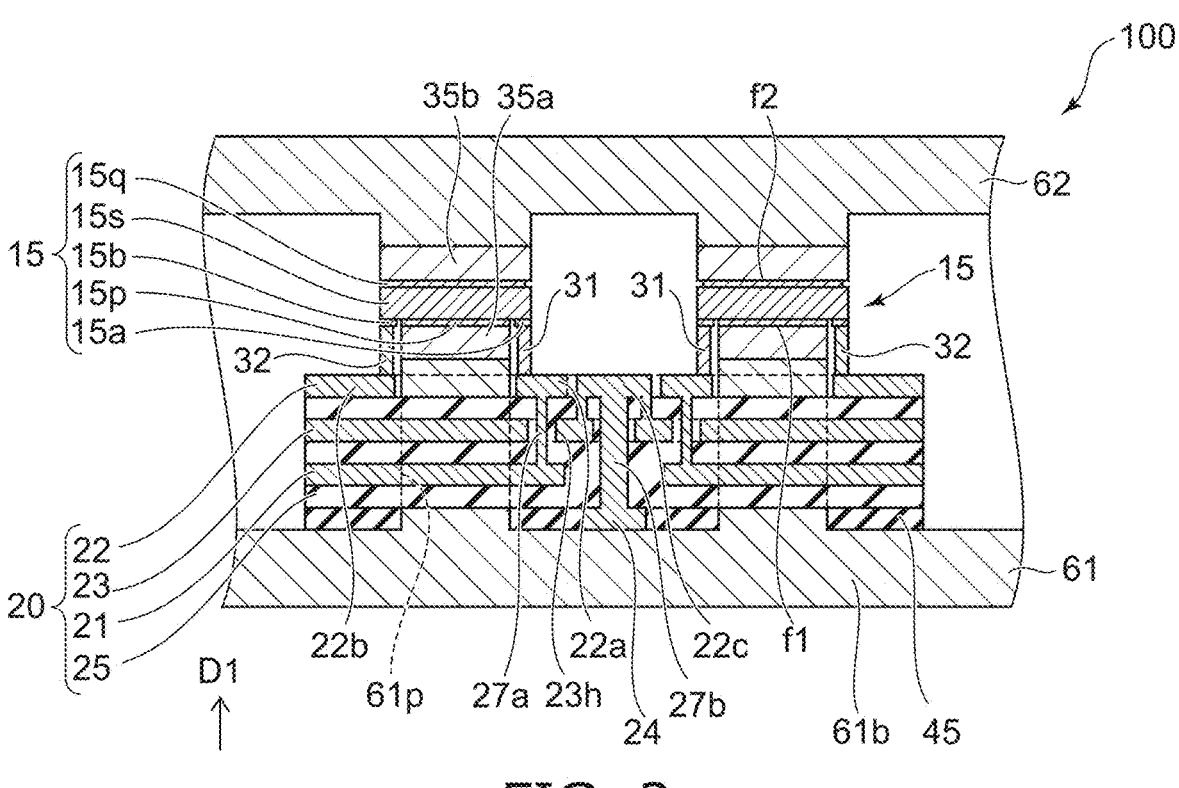
FIG. 2 is an A-A cross-sectional view of FIG. 1.
Figure 3:
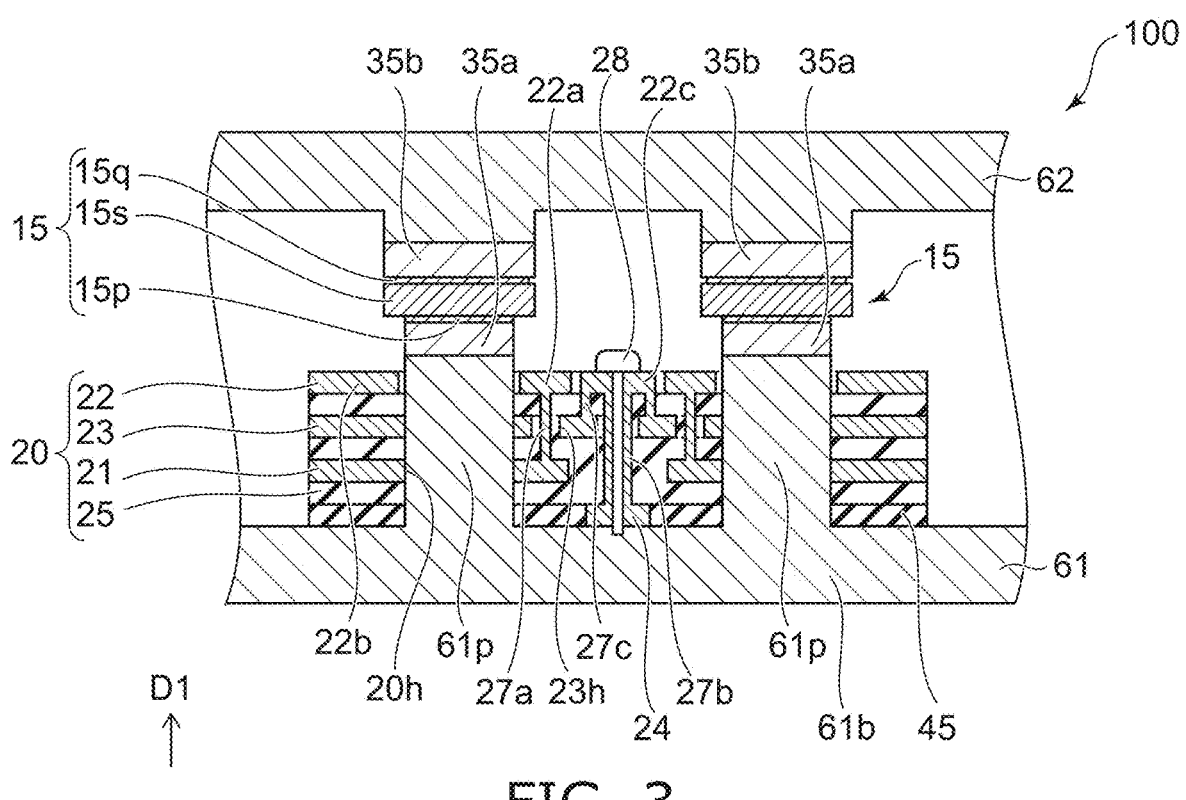
FIG. 3 is a B-B cross-sectional view of FIG. 1.

As shown in FIGS. 2 and 3, a semiconductor device 100 according to a first embodiment includes a first conductive member 61, a second conductive member 62, an interconnection member 20, and multiple semiconductor chips 15.

A direction from the first conductive member 61 toward the second conductive member 62 is set as a first direction D1. FIGS. 2 and 3 show cross sections parallel to the first direction D1. FIG. 2 shows a cross section (cross section taken along A-A in FIG. 1) of a portion where a first gate pad 15a and a second gate pad 15b to be described later are located. FIG. 3 shows a cross section (cross section taken along B-B in FIG. 1) of a portion of the first conductive member 61 where a first convex portion 61p to be described later is located. The first gate pad 15a and the second gate pad 15b are located at, for example, diagonal positions of the semiconductor chips 15.

The interconnection member 20 is located between the first conductive member 61 and the second conductive member 62 in the first direction D1.

The multiple semiconductor chips 15 are located between the second conductive member 62 and the interconnection member 20 in the first direction D1. As shown in FIG. 1, the multiple semiconductor chips 15 are disposed side by side in a plane perpendicular to the first direction D1.

As shown in FIG. 2, the semiconductor chips 15 include a semiconductor layer 15s, a first electrode 15p, the first gate pad 15a, the second gate pad 15b, and a second electrode 15q.

The first electrode 15p and the second electrode 15q are located away from each other in the first direction D1. The first electrode 15p, the first gate pad 15a, and the second gate pad 15b are located between the first conductive member 61 and the semiconductor layer 15s. The second electrode 15q is located between the semiconductor layer 15s and the second conductive member 62.

The semiconductor layer 15s has a first face f1 and a second face f2. The first face f1 is located between the first conductive member 61 and the second face f2. The second face f2 is located between the first face f1 and the second conductive member 62. The first face f1 faces the first conductive member 61, and the second face f2 faces the second conductive member 62. The first electrode 15p, the first gate pad 15a, and the second gate pad 15b are provided on the first face ft. The second electrode 15q is provided on the second face f2.

The first conductive member 61 is electrically connected to the first electrode 15p. The second conductive member 62 is electrically connected to the second electrode 15q. A stress in a direction from the first conductive member 61 to the multiple semiconductor chips 15 and a stress in a direction from the second conductive member 62 to the multiple semiconductor chips 15 are applied to the multiple semiconductor chips 15. The semiconductor device 100 is, for example, a press pack semiconductor device.

The interconnection member 20 includes a first interconnection layer 21, a second interconnection layer 22, a third interconnection layer 23, and insulating layers 25. The third interconnection layer 23 is located between the first interconnection layer 21 and the second interconnection layer 22 in the first direction D1. The insulating layers 25 are located between the first interconnection layer 21 and the third interconnection layer 23 and between the second interconnection layer 22 and the third interconnection layer 23.

A position of the second interconnection layer 22 in the first direction D1 is between a position of the third interconnection layer 23 in the first direction D1 and positions of the multiple semiconductor chips 15 in the first direction D1. The second interconnection layer 22 faces the multiple semiconductor chips 15.

The second interconnection layer 22 has a first connection region 22a and a second connection region 22b. The first connection region 22a and the second connection region 22b are insulated from each other. The first connection region 22a is electrically connected to the first interconnection layer 21. The interconnection member 20 further includes a first connection portion 27a. The first connection portion 27a electrically connects the first interconnection layer 21 and the second connection region 22b of the second interconnection layer 22. The first connection portion 27a extends in the first direction D1 through the insulating layer 25. The third interconnection layer 23 has a third interconnection layer hole 23h. The first connection portion 27a passes through the third interconnection layer hole 23h. The first connection portion 27a is insulated from the third interconnection layer 23.

A first connection member 31 is provided between the first connection region 22a of the second interconnection layer 22 and the first gate pad 15a. The first connection member 31 electrically connects the first connection region 22a and the first gate pad 15a.

A second connection member 32 is located between the second connection region 22b of the second interconnection layer 22 and the second gate pad 15b. The second connection member 32 electrically connects the second connection region 22b and the second gate pad 15b.

The first connection member 31 and the second connection member 32 are preferably elastic members. Accordingly, the gate pads 15a and 15b and the second interconnection layer 22 can be stably connected. The first connection member 31 and the second connection member 32 are, for example, spring pins.

As shown in FIG. 3, the first conductive member 61 may include a first base portion 61b and the first convex portion 61p. The first convex portion 61p protrudes from the first base portion 61b toward the second conductive member 62.

As shown in FIG. 3, the interconnection member 20 may have, for example, an interconnection member hole 20h. The first convex portion 61p of the first conductive member 61 passes through the interconnection member hole 20h. An end portion of the first convex portion 61p faces the multiple semiconductor chips 15. The interconnection member 20 is provided on the first base portion 61b of the first conductive member 61 or on the first base portion 61b of the first conductive member 61 via an insulating plate 45.

The semiconductor device 100 may include a first conductive plate 35a and a second conductive plate 35b. The first conductive plate 35a is located between the first convex portion 61p of the first conductive member 61 and the first electrode 15p of the semiconductor chips 15. The second conductive plate 35b is located between the second electrode 15q of the semiconductor chips 15 and the second conductive member 62. The first conductive plate 35a electrically connects the first conductive member 61 and the first electrode 15p of the semiconductor chips 15. The second conductive plate 35b electrically connects the second electrode 15q of the semiconductor chips 15 and the second conductive member 62.

The first conductive plate 35a and the second conductive plate 35b are, for example, Mo plates. The first conductive member 61 and the second conductive member 62 are made of, for example, Cu.

As shown in FIG. 3, the second interconnection layer 22 may further have a third connection region 22c. The interconnection member 20 may further include a second connection portion 27b and a fourth interconnection layer 24. The fourth interconnection layer 24 is located between the first interconnection layer 21 and the first conductive member 61 in the first direction D1. The second connection portion 27b extends in the first direction D1 through the insulating layer 25. The second connection portion 27b electrically connects the fourth interconnection layer 24 and the third connection region 22c of the second interconnection layer 22. The second connection portion 27b, the first connection region 22a and the second connection region 22b are insulated from one another.

The interconnection member 20 may further include a third connection portion 27c. The third connection portion 27c extends in the first direction D1 through the insulating layer 25. The third connection portion 27c electrically connects the third connection region 22c of the second interconnection layer 22 and the third interconnection layer 23.

With such a configuration, the third interconnection layer 23 is electrically connected to the fourth interconnection layer 24 via the third connection portion 27c, the third connection region 22c, and the second connection portion 27b. The fourth interconnection layer 24 is electrically connected to the first conductive member 61. Accordingly, the third interconnection layer 23 is electrically connected to the first conductive member 61.

The semiconductor device 100 may include a fixing member 28. As the fixing member 28, for example, a conductive screw can be used. The fixing member 28 penetrates the third connection region 22c of the second interconnection layer 22, the second connection portion 27b, and the fourth interconnection layer 24 and is coupled to the first conductive member 61. The interconnection member 20 is fixed to the first conductive member 61 by the fixing member 28. The third interconnection layer 23 is electrically connected to the first conductive member 61 by the fixing member 28.

The semiconductor device 100 may further include the insulating plate 45. The insulating plate 45 is located between the first base portion 61b of the first conductive member 61 and the interconnection member 20. The insulating plate 45 electrically insulates the first conductive member 61 from a portion of the interconnection member 20 to be insulated. The insulating plate may include, for example, glass epoxy.

Figure 4:
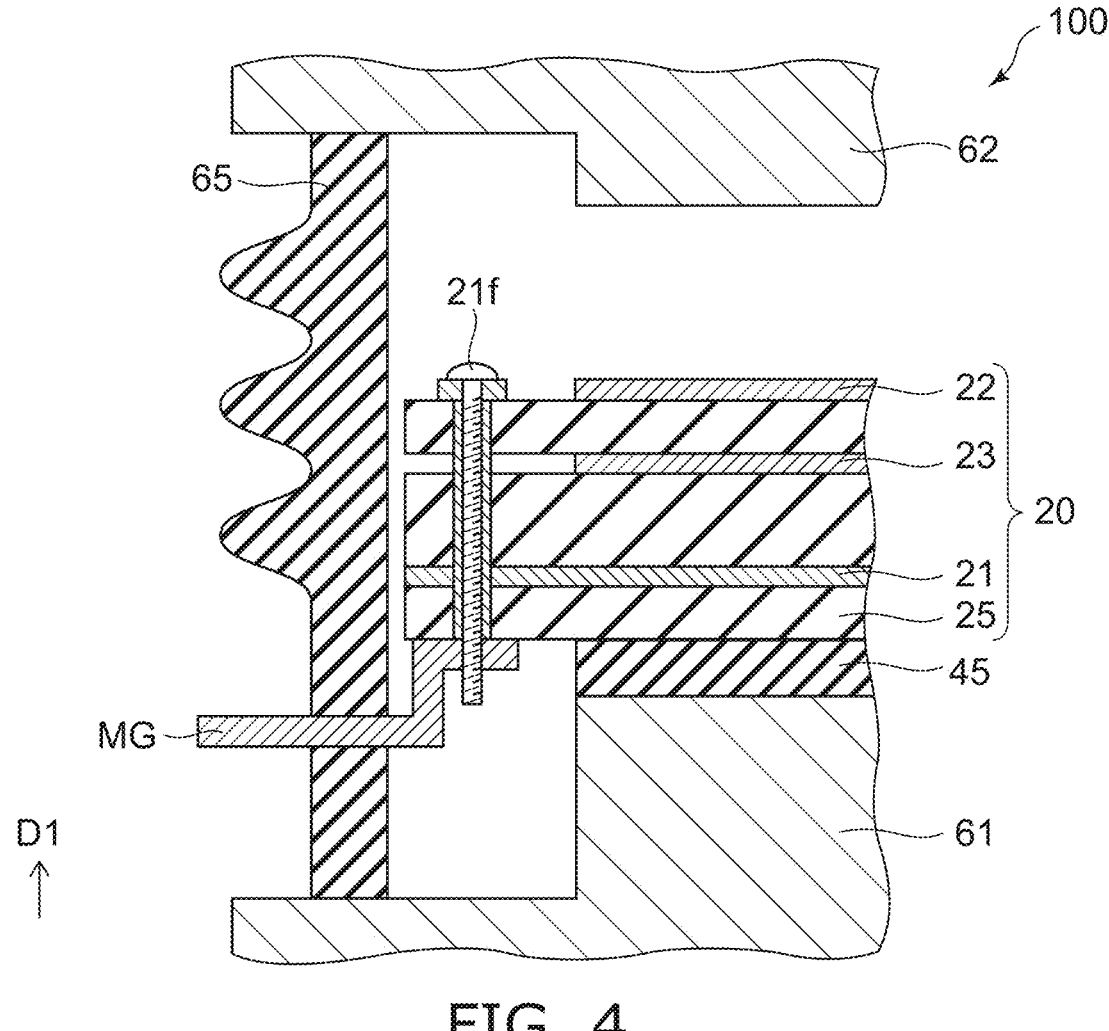
FIG. 4 to FIG. 6 are schematic cross-sectional views of the semiconductor device of the first embodiment.
Figure 5:
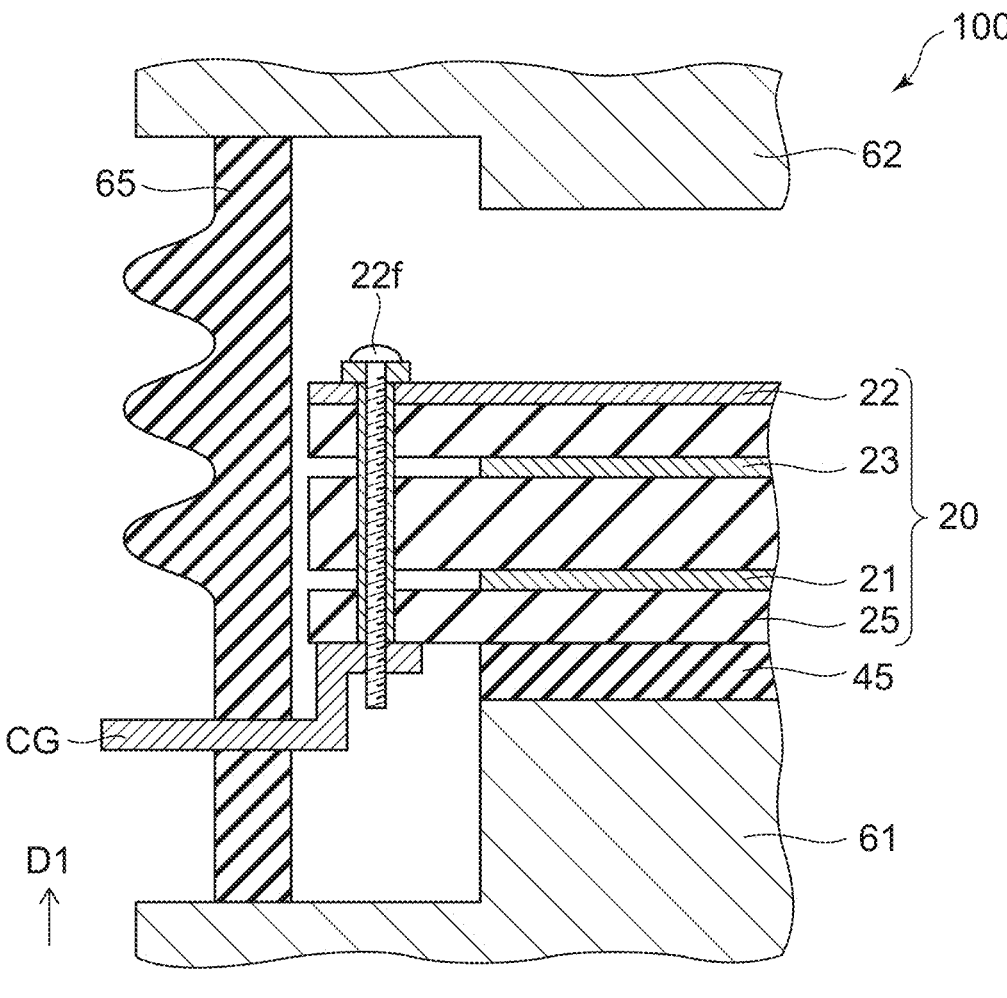
Figure 6:
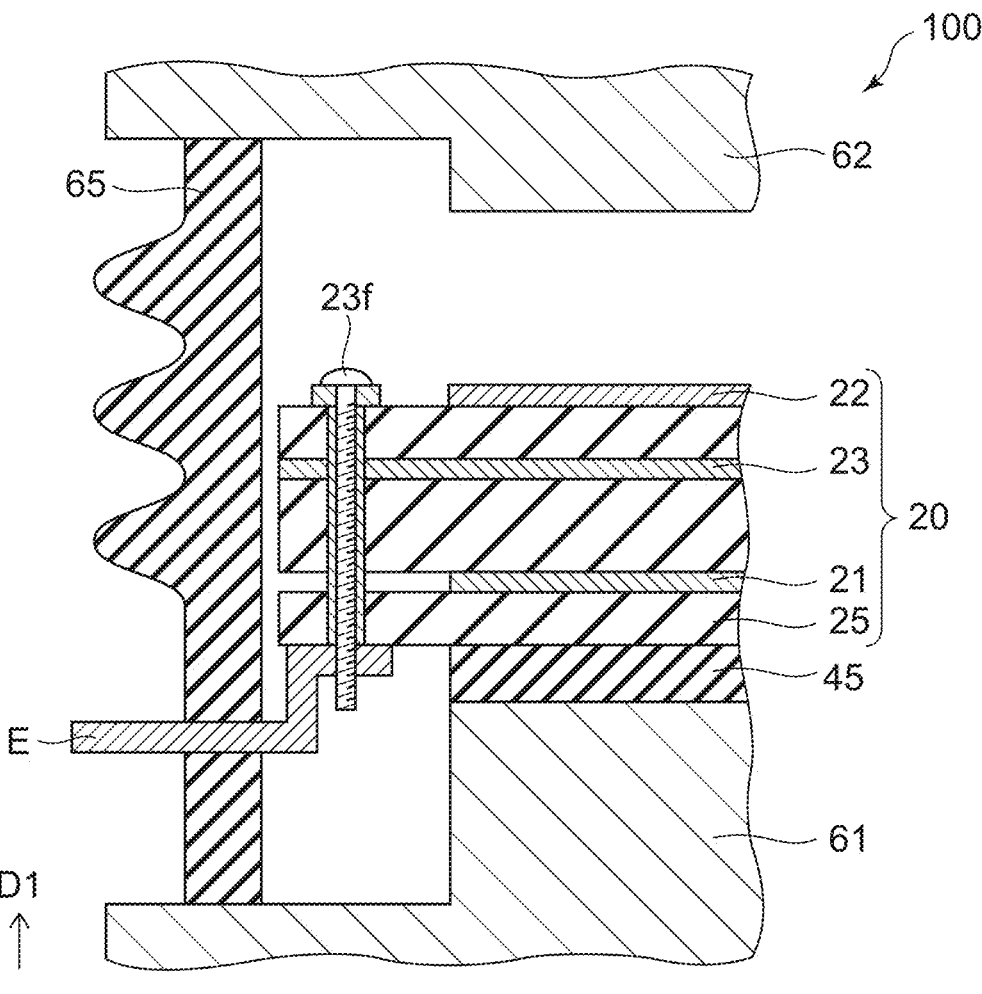

As shown in FIGS. 4 to 6, the semiconductor device 100 can further include an insulating member 65 provided at an outer edge portion of the semiconductor device 100. The insulating member 65 continuously surrounds a side of a space, in which the multiple semiconductor chips 15 and the interconnection member are disposed, between the first conductive member 61 and the second conductive member 62. As a material of the insulating member 65, for example, ceramic can be used.

The semiconductor device 100 further includes multiple terminals. As shown in FIG. 1, the multiple terminals include a first gate terminal MG, a second gate terminal CG, and a sense terminal E. The first gate terminal MG, the second gate terminal CG, and the sense terminal E extend from the interconnection member 20 to the outside of the semiconductor device 100 in a direction intersecting the first direction D1. A portion where the terminal is exposed to the outside of the semiconductor device 100 from the insulating member 65 is referred to as a connection portion. When an outer periphery of an outer shape (a substantially circular shape in FIG. 1) in a plan view of the semiconductor device 100 which is a press pack semiconductor is divided into two portions (substantially arc shapes in FIG. 1) arc1 and arc2 in which a connection portion of the first gate terminal MG and a connection portion of the second gate terminal CG are formed as end portions, the outer periphery of the portion arc2 including a connection portion of the sense terminal E is smaller. A difference between a distance between the connection portion of the first gate terminal MG and the connection portion of the sense terminal E and a distance between the connection portion of the second gate terminal CG and the connection portion of the sense terminal E is, for example, 0 mm or more and 15 mm or less. A variation in gate operation due to a difference in parasitic inductance for each current path described later is prevented.

FIG. 4 shows a cross section of a portion where the first gate terminal MG is provided. The first gate terminal MG penetrates the insulating member 65 from the interconnection member 20 and is exposed to the outside of the semiconductor device 100. The first gate terminal MG is electrically connected to the first interconnection layer 21 by a conductive fixing member 21$f$ (for example, a screw). Accordingly, the first gate terminal MG is electrically connected to the first gate pad 15$a$ of the semiconductor chips 15 via the first interconnection layer 21, the first connection portion 27$a$, the first connection region 22$a$ of the second interconnection layer 22, and the first connection member 31.

FIG. 5 shows a cross section of a portion where the second gate terminal CG is provided. The second gate terminal CG penetrates the insulating member 65 from the interconnection member 20 and is exposed to the outside of the semiconductor device 100. The second gate terminal CG is electrically connected to the second interconnection layer 22 by a conductive fixing member 22$f$ (for example, a screw). Accordingly, the second gate terminal CG is electrically connected to the second gate pad 15$b$ of the semiconductor chips 15 via the second connection region 22$b$ of the second interconnection layer 22 and the second connection member 32.

FIG. 6 shows a cross section of a portion where the sense terminal E is provided. The sense terminal E penetrates the insulating member 65 from the interconnection member 20 and is exposed to the outside of the semiconductor device 100. The sense terminal E is electrically connected to the third interconnection layer 23 by a conductive fixing member 23$f$ (for example, a screw). Accordingly, the sense terminal E is electrically connected to the first conductive member 61 via the third interconnection layer 23, the third connection portion 27$c$, the third connection region 22$c$ of the second interconnection layer 22, the second connection portion 27$b$, and the fourth interconnection layer 24.

As shown in FIG. 1, in a plan view perpendicular to the first direction D1, the sense terminal E is located between the first gate terminal MG and the second gate terminal CG. In the example in FIG. 1, the first gate terminal MG is located on a left side of the sense terminal E, and the second gate terminal CG is located on a right side of the sense terminal E. However, the first gate terminal MG may be located on the right side of the sense terminal E and the second gate terminal CG may be located on the left side of the sense terminal E.

The semiconductor chips 15 may include, for example, an insulated gate bipolar transistor (IGBT). The first electrode 15$p$ corresponds to, for example, an emitter electrode. The second electrode 15$q$ corresponds to, for example, a collector electrode.

Figure 7:
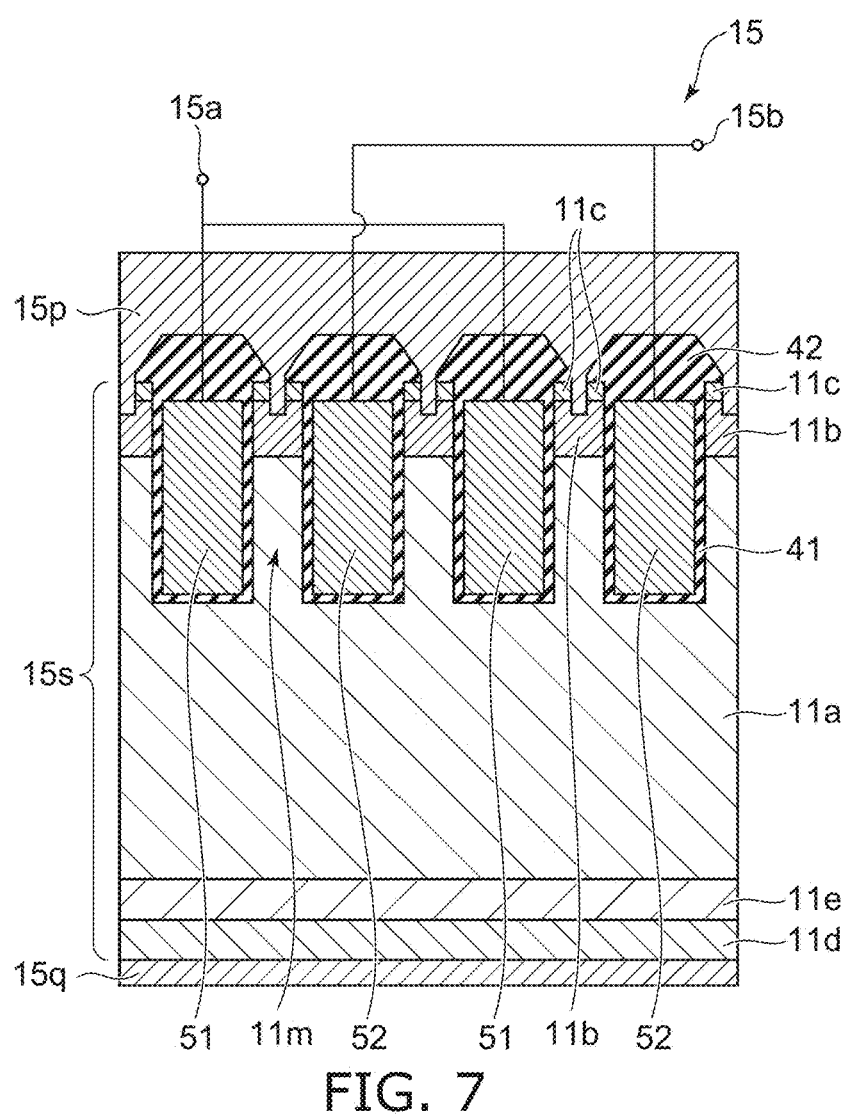
FIG. 7 is a schematic cross-sectional view of a semiconductor chip of embodiments.

FIG. 7 is a schematic cross-sectional view of the semiconductor chips 15.

The semiconductor layer 15$s$ includes a first semiconductor layer 11$a$ of a first conductivity-type, a second semiconductor layer 11$b$ of a second conductivity-type, a third semiconductor layer 11$c$ of the first conductivity-type, and a fourth semiconductor layer 11$d$ of the second conductivity-type. In the embodiment, for example, the first conductivity-type is n-type, and the second conductivity-type is p-type.

The semiconductor chips 15 have, for example, a trench gate structure. The semiconductor layer 15$s$ includes a mesa portion 11$m$ adjacent to a trench gate. The mesa portion 11$m$ includes a portion of the first semiconductor layer 11$a$, the second semiconductor layer 11$b$, and the third semiconductor layer 11$c$.

The first semiconductor layer 11$a$ is, for example, an n-type drift layer in the IGBT. The second semiconductor layer 11$b$ is, for example, a p-type base layer in the IGBT. The second semiconductor layer 11$b$ is provided on the first semiconductor layer 11$a$.

The third semiconductor layer 11$c$ is, for example, an n-type emitter layer in the IGBT. An n-type impurity concentration of the third semiconductor layer 11$c$ is higher than an n-type impurity concentration of the first semiconductor layer 11$a$. The third semiconductor layer 11$c$ is provided on the second semiconductor layer 11$b$ and is electrically connected to the first electrode 15$p$.

The fourth semiconductor layer 11$d$ is, for example, a p-type collector layer in the IGBT. A p-type impurity concentration of the fourth semiconductor layer 11$d$ is higher than a p-type impurity concentration of the second semiconductor layer 11$b$. The fourth semiconductor layer 11$d$ is located between the first electrode 15$p$ and the first semiconductor layer 11$a$ and is electrically connected to the second electrode 15$q$.

The semiconductor layer 15$s$ may further include a fifth semiconductor layer 11$e$ of the first conductivity-type. The fifth semiconductor layer 11$e$ is, for example, an n-type buffer layer in the IGBT. An n-type impurity concentration of the fifth semiconductor layer 11$e$ is higher than an n-type impurity concentration of the first semiconductor layer 11$a$. The fifth semiconductor layer 11$e$ is located between the fourth semiconductor layer 11$d$ and the first semiconductor layer 11$a$.

The semiconductor chips 15 include first gate electrodes 51 and second gate electrodes 52. The first gate electrodes 51 and the second gate electrodes 52 are located between the semiconductor layer 15s and the first electrode 15p. The first gate electrodes 51 and the second gate electrodes 52 are electrically separated from one another.

A structure shown in FIG. 7 is repeated multiple times in a lateral direction. For example, the first gate electrodes 51 and the second gate electrodes 52 are alternately repeated in the lateral direction of FIG. 7. In a depth direction of FIG. 7, the multiple first gate electrodes 51 are electrically connected to the first gate pad 15a. In the depth direction of FIG. 7, the multiple second gate electrodes 52 are electrically connected to the second gate pad 15b.

An insulating film 41 is located between the first gate electrode 51 and the semiconductor layer 15s and between the second gate electrode 52 and the semiconductor layer 15s. The first gate electrodes 51 and the second gate electrodes 52 are adjacent to the mesa portion 11m via the insulating film 41. An interlayer insulating film 42 is located between the first gate electrode 51 and the first electrode 15p and between the second gate electrode 52 and the first electrode 15p.

When a gate voltage $V_{MG}$ applied to the first gate electrode 51 is higher than a threshold voltage of the first gate electrode 51, a first channel (n-type inversion layer) is induced in a region of the second semiconductor layer 11b facing the first gate electrode 51. Electrons are injected from the first electrode 15p into the first semiconductor layer 11a via the third semiconductor layer 11c and the first channel. Accordingly, electron holes are injected from the fourth semiconductor layer 11d into the first semiconductor layer 11a via the fifth semiconductor layer 11e.

When a gate voltage $V_{CG}$ applied to the second gate electrode 52 is higher than a threshold voltage of the second gate electrode 52, a second channel (n-type inversion layer) is induced in a region of the second semiconductor layer 11b facing the second gate electrode 52. Electrons are injected from the first electrode 15p into the first semiconductor layer 11a via the third semiconductor layer 11c and the first channel. Accordingly, electron holes are injected from the fourth semiconductor layer 11d into the first semiconductor layer 11a via the fifth semiconductor layer 11e.

The first gate electrodes 51 and the second gate electrodes 52 are controlled independently of one another. By turning off the second gate electrode 52 before the first gate electrode 51, the number of electrons injected into the first semiconductor layer 11a can be reduced, and a turn-off loss can be reduced.

Figure 8:
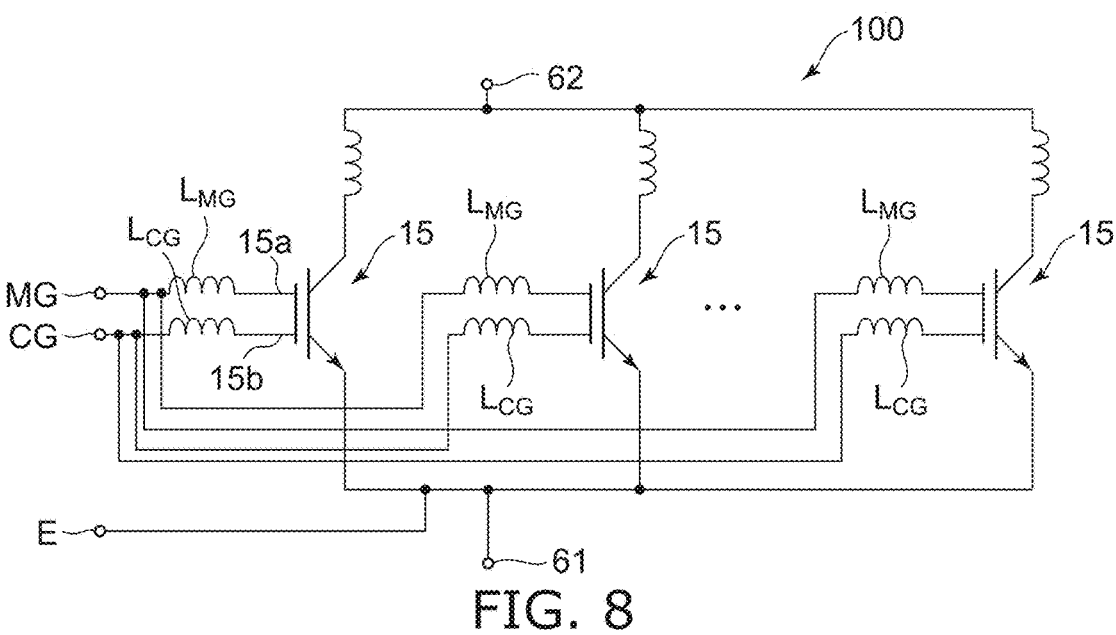
FIG. 8 is an equivalent circuit diagram of the semiconductor device of the first embodiment.

FIG. 8 is an equivalent circuit diagram of the semiconductor device 100.

The multiple semiconductor chips 15 are connected in parallel between the first conductive member 61 and the second conductive member 62. In the semiconductor device 100, a current (for example, a main current) flowing between the first conductive member 61 and the second conductive member 62 is controlled by a gate potential (or a gate signal) supplied to at least one of the first gate terminal MG and the second gate terminal CG. A sense current shunted from the main current is detected by the sense terminal E. A potential of the sense terminal E serves as a reference of a potential of the first gate terminal MG and a potential of the second gate terminal CG.

The first gate terminal MG, the second gate terminal CG, and the sense terminal E are electrically connected to a drive circuit that drives the semiconductor device 100. A first gate signal output from the drive circuit is input to the semiconductor chips 15 via the first gate terminal MG, the interconnection member 20, and the first gate pad 15a. A second gate signal output from the drive circuit is input to the semiconductor chips via the second gate terminal CG, the interconnection member 20, and the second gate pad 15b.

A parasitic inductance $L_{MG}$ is present in a current path between the first gate terminal MG and the first gate pad 15a. A parasitic inductance $L_{CG}$ is present in a current path between the second gate terminal CG and the second gate pad 15b. A mutual inductance (parasitic mutual inductance) is generated between the parasitic inductance $L_{MG}$ and the parasitic inductance $L_{CG}$. The parasitic mutual inductance causes an unintended variation in gate potential, and may cause an erroneous operation of the semiconductor device 100.

According to the embodiment, as shown in FIG. 1, in a plan view, the sense terminal E is located between the first gate terminal MG and the second gate terminal CG. Directions of currents flowing through the first gate terminal MG and the sense terminal E when a potential is applied to the first gate electrode 51 of the semiconductor chips 15 are indicated by solid line arrows in FIG. 1. Directions of currents flowing through the second gate terminal CG and the sense terminal E when a potential is applied to the second gate electrode 52 of the semiconductor chips 15 are indicated by broken line arrows in FIG. 1. A magnetic field generated by the current flowing through the first gate terminal MG and a magnetic field generated by the current flowing through the second gate terminal CG cancel each other out. Accordingly, the parasitic mutual inductance can be reduced, and reliability of the operations of the semiconductor device 100 can be improved.

Here, a configuration in which the second gate terminal CG is located between the sense terminal E and the first gate terminal MG in a plan view similar to FIG. 1 serves as a comparative example. In the comparative example, the first gate terminal MG and the second gate terminal CG are adjacent to each other in the plan view. In the comparative example, the first conductive member 61 is connected to the first interconnection layer 21, the second gate pad 15b is connected to the second interconnection layer 22, and the first gate pad 15a is connected to the third interconnection layer 23. An average and a variance of the parasitic mutual inductances shown below are calculated values by simulation. In the comparative example, the average of the parasitic mutual inductances was 18.5 nH, and the variance was 3.09 nH. In contrast, in the first embodiment, the average of the parasitic mutual inductances was 7.79 nH and the variance was 2.97 nH. That is, according to the first embodiment, the variance of the parasitic mutual inductances was equal to that in the comparative example, and the average was reduced by about 58% as compared with that in the comparative example.

As shown in FIG. 2, in the first direction D1, the third interconnection layer 23 connected to the sense terminal E is located between the first interconnection layer 21 connected to the first gate terminal MG and the second interconnection layer 22 connected to the second gate terminal CG. Accordingly, a magnetic field generated by the current flowing through the first interconnection layer 21 and a magnetic field generated by the current flowing through the second interconnection layer 22 cancel each other out. Therefore, a parasitic mutual inductance between a parasitic inductance of the first interconnection layer 21 and a parasitic inductance of the second interconnection layer 22 can be reduced.

Second Embodiment

Figure 9:
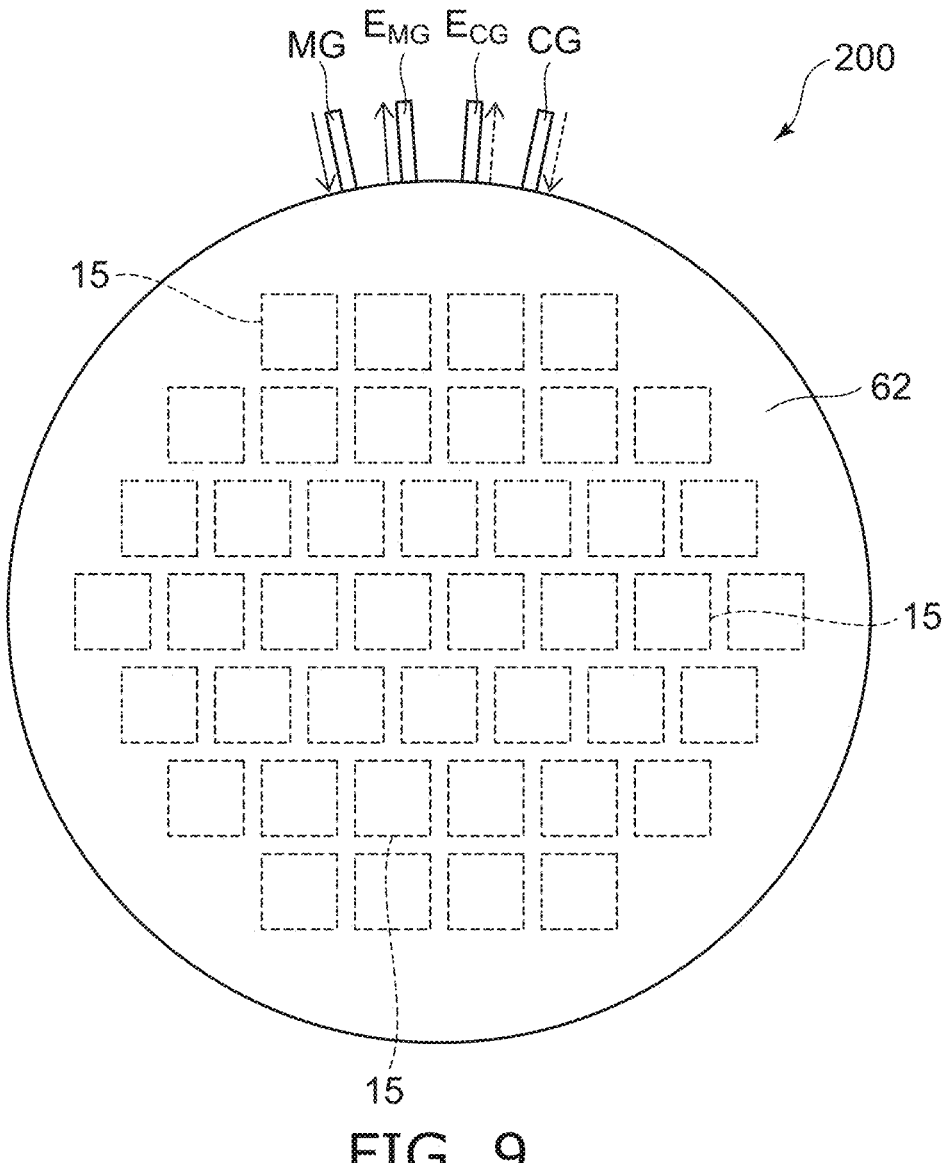
FIG. 9 is a schematic plan view of a semiconductor device of a second embodiment.

FIG. 9 is a schematic plan view of a semiconductor device 200 according to a second embodiment.

Figure 10:
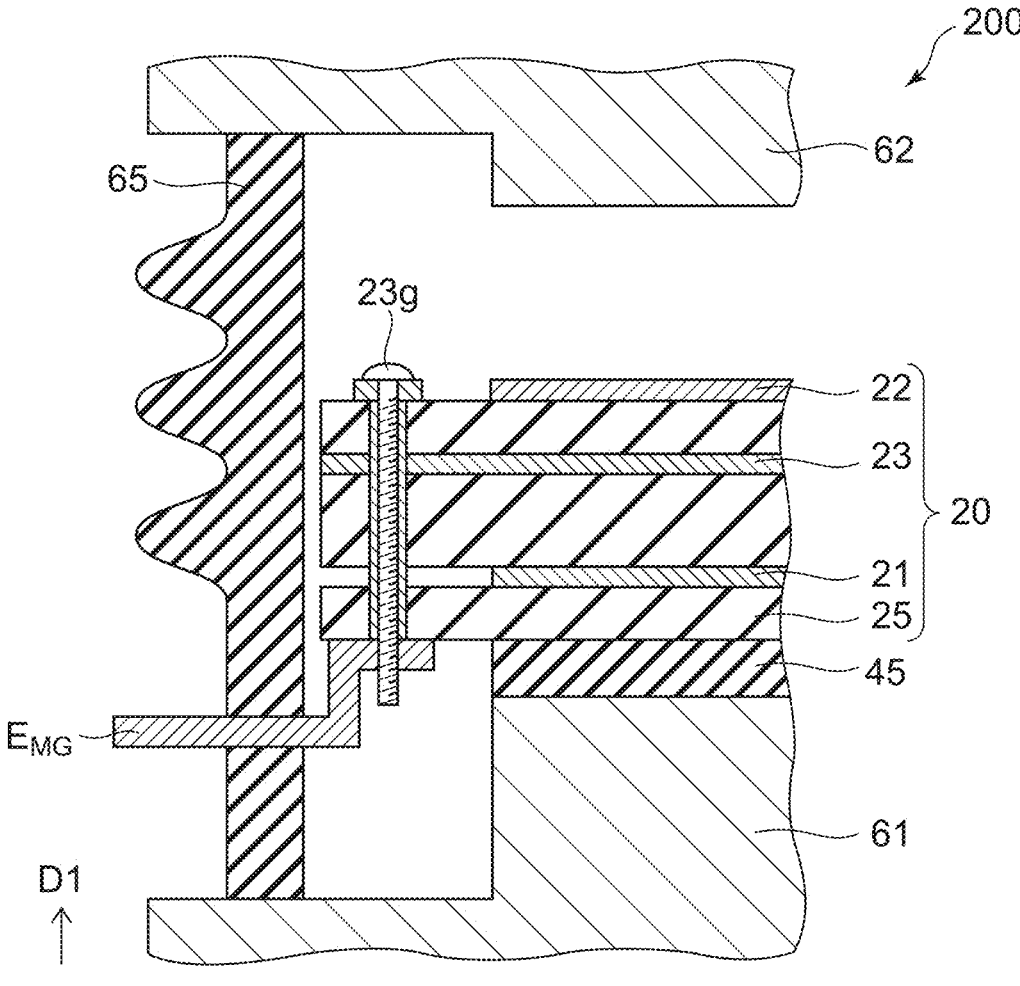
FIG. 10 and FIG. 11 are schematic cross-sectional views of the semiconductor device of the second embodiment.

In the semiconductor device 200 according to the second embodiment, the sense terminal includes a first sense terminal $E_{MG}$ and a second sense terminal $E_{CG}$. Except for this, the semiconductor device 200 according to the second embodiment has the same members as those of the semiconductor device 100 according to the first embodiment. The first sense terminal $E_{MG}$ and the second sense terminal $E_{CG}$ extend from the interconnection member 20 to the outside of the semiconductor device 200 in a direction intersecting the first direction D1. FIG. 10 shows a cross section of a portion where the first sense terminal $E_{MG}$ is provided. The first sense terminal $E_{MG}$ penetrates the insulating member 65 from the interconnection member 20 and is exposed to the outside of the semiconductor device 200. The first sense terminal $E_{MG}$ is electrically connected to the third interconnection layer 23 by a conductive fixing member 23g (for example, a screw). Accordingly, the first sense terminal $E_{MG}$ is electrically connected to the first conductive member 61 via the third interconnection layer 23, the third connection portion 27c, the third connection region 22c of the second interconnection layer 22, the second connection portion 27b, and the fourth interconnection layer 24.

Figure 11:
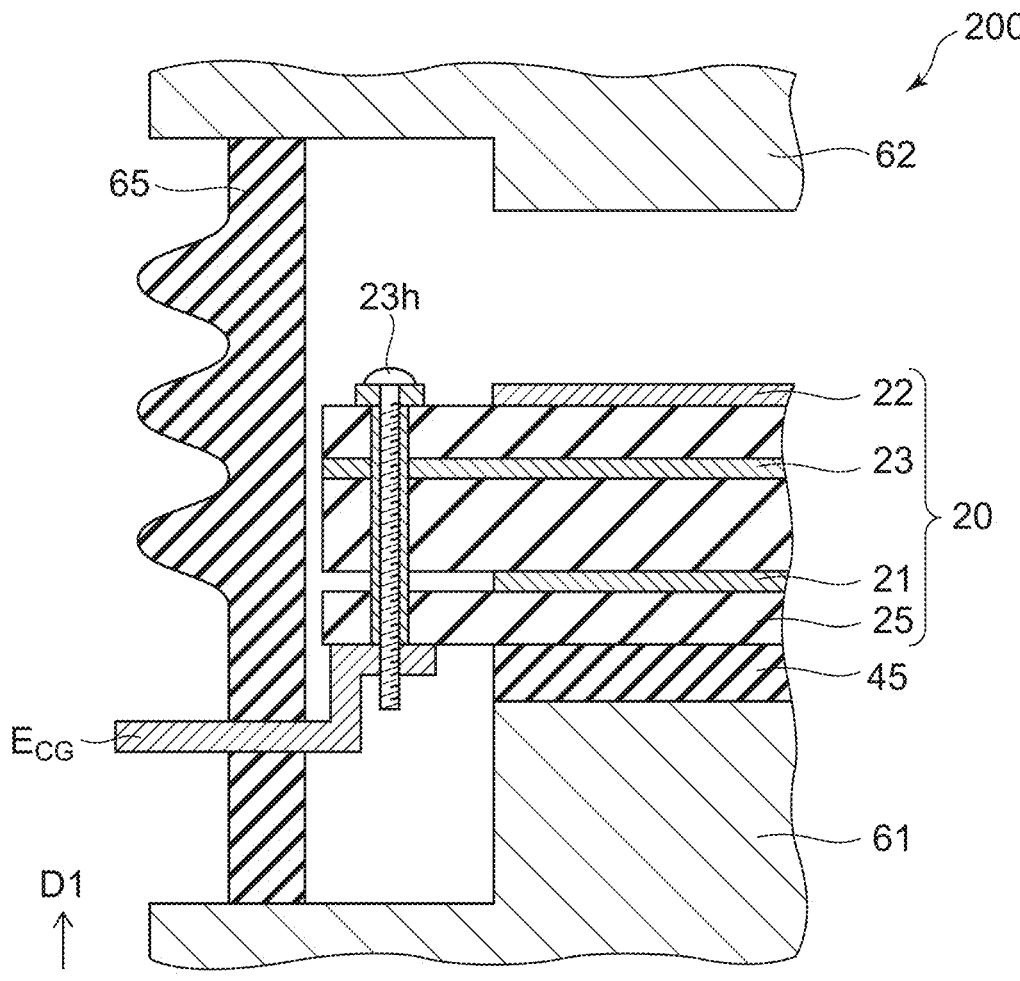

FIG. 11 shows a cross section of a portion where the second sense terminal $E_{CG}$ is provided. The second sense terminal $E_{CG}$ penetrates the insulating member 65 from the interconnection member 20 and is exposed to the outside of the semiconductor device 200. The second sense terminal $E_{CG}$ is electrically connected to the third interconnection layer 23 by a conductive fixing member 23h (for example, a screw). Accordingly, the second sense terminal $E_{CG}$ is electrically connected to the first conductive member 61 via the third interconnection layer 23, the third connection portion 27c, the third connection region 22c of the second interconnection layer 22, the second connection portion 27b, and the fourth interconnection layer 24.

The first sense terminal $E_{MG}$ and the second sense terminal $E_{CG}$ are electrically connected to a drive circuit that drives the semiconductor device 200. A sense current shunted from the main current is detected by each of the first sense terminal $E_{MG}$ and the second sense terminal $E_{CG}$. A potential of the first sense terminal $E_{MG}$ serves as the reference of the potential of the first gate terminal MG, and a potential of the second sense terminal $E_{CG}$ serves as the reference of the potential of the second gate terminal CG. Directions of currents flowing through the first gate terminal MG and the first sense terminal $E_{MG}$ when a potential is applied to the first gate electrode 51 of the semiconductor chips are indicated by solid line arrows in FIG. 9. Directions of currents flowing through the second gate terminal CG and the second sense terminal $E_{CG}$ when a potential is applied to the second gate electrode 52 of the semiconductor chips 15 are indicated by broken line arrows in FIG. 9. As compared with the first embodiment, the sense current is separated.

A difference between a distance between the connection portion of the first gate terminal MG and a connection portion of the first sense terminal $E_{MG}$ and a distance between the connection portion of the second gate terminal CG and a connection portion of the second sense terminal $E_{CG}$ is, for example, 0 mm or more and 15 mm or less.

In a plan view perpendicular to the first direction D1, the first sense terminal $E_{MG}$ is located adjacent to the first gate terminal MG, and the second sense terminal $E_{CG}$ is located adjacent to the second gate terminal CG. Accordingly, the magnetic field generated by the current flowing through the first gate terminal MG and the magnetic field generated by the current flowing through the second gate terminal CG cancel each other out, and the parasitic mutual inductance can be reduced.

In the plan view perpendicular to the first direction D1, the first sense terminal $E_{MG}$ and the second sense terminal $E_{CG}$ are located between the first gate terminal MG and the second gate terminal CG, so that the parasitic mutual inductance can be further reduced.

In the second embodiment, an average of the parasitic mutual inductances was 1.59 nH, and a variance was 2.99 nH. That is, according to the second embodiment, the average of the parasitic mutual inductances can be reduced by about 80% as compared with that in the first embodiment.

Third Embodiment

Figure 12:
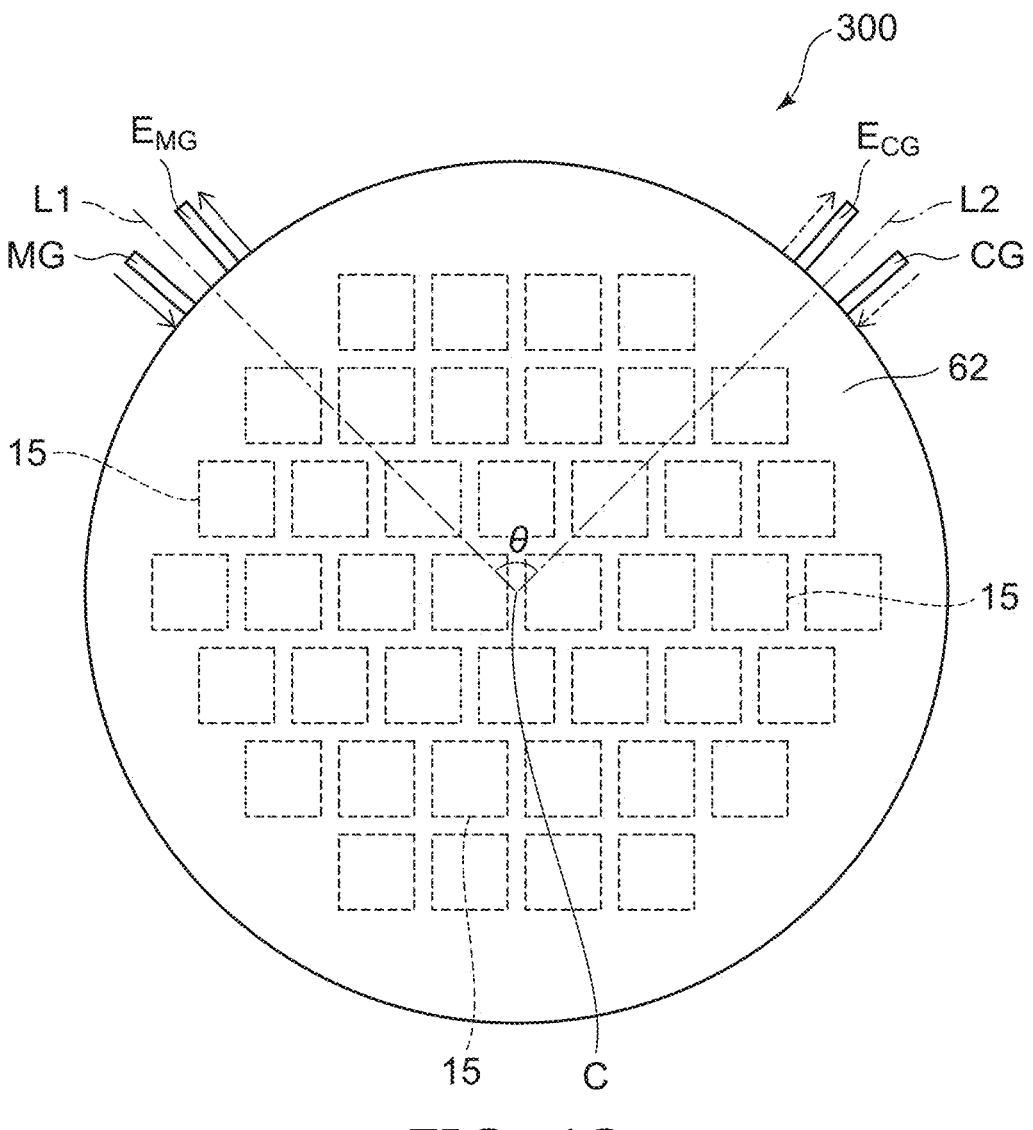
FIG. 12 is a schematic plan view of a semiconductor device of a third embodiment.

FIG. 12 is a schematic plan view of a semiconductor device 300 according to a third embodiment.

The semiconductor device 300 according to the third embodiment has the same members as those of the semiconductor device 200 according to the second embodiment. In the semiconductor device 300 according to the third embodiment, an angle θ formed by a first imaginary line L1 and a second imaginary line L2 shown in FIG. 12 is 45° or more and 135° or less. Preferably, the angle θ is 75° or more and 105° or less.

In a plan view perpendicular to the first direction D1, the first imaginary line L1 is a straight line passing through a position having an equal distance from the first gate terminal MG and the first sense terminal $E_{MG}$ between the first gate terminal MG and the first sense terminal $E_{MG}$. Further, in the plan view, the second imaginary line L2 is a straight line passing through a position having an equal distance from the second gate terminal CG and the second sense terminal $E_{CG}$ between the second gate terminal CG and the second sense terminal $E_{CG}$. For example, in the plan view, a center C of the semiconductor device 300 can be located on the first imaginary line L1 and the second imaginary line L2. For example, in the plan view, the second conductive member 62 has a circular outer edge, and the center C of the semiconductor device 300 coincides with a center of the circular outer edge of the second conductive member 62. An angle formed by a line segment connecting a connection point of the first gate terminal MG and the center C and a line segment connecting a connection point of the first sense terminal $E_{MG}$ and the center C is, for example, 1° or more and 30° or less. An angle formed by a line segment connecting a connection point of the second gate terminal CG and the center C and a line segment connecting a connection point of the second sense terminal $E_{CG}$ and the center C is, for example, 1° or more and 30° or less.

Directions of currents flowing through the first gate terminal MG and the first sense terminal $E_{MG}$ when a potential is applied to the first gate electrode 51 of the semiconductor chips are indicated by solid line arrows in FIG. 12. Directions of currents flowing through the second gate terminal CG and the second sense terminal $E_{CG}$ when a potential is applied to the second gate electrode 52 of the semiconductor chips 15 are indicated by broken line arrows in FIG. 12.

By setting the angle θ formed by the first imaginary line L1 and the second imaginary line L2 to 45° or more and 135° or less, a first sense current flowing toward the first sense terminal $E_{MG}$ in the third interconnection layer 23 and a second sense current flowing toward the second sense terminal $E_{CG}$ in the third interconnection layer 23 cross each other, and the parasitic mutual inductance can be reduced.

In the third embodiment, when 6=80°, an average of the parasitic mutual inductances was 0.34 nH, and a variance was 3.07 nH. That is, according to the third embodiment, the average of the parasitic mutual inductances can be reduced by about 79% as compared with that in the above second embodiment (6=160).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first conductive member;
a second conductive member;
an interconnection member located between the first conductive member and the second conductive member;
a plurality of semiconductor chips located between the second conductive member and the interconnection member in a first direction from the first conductive member to the second conductive member; and
a plurality of terminals extending from the interconnection member in a direction intersecting the first direction,
one semiconductor chip of the plurality of semiconductor chips including:
a semiconductor layer,
a first electrode located between the first conductive member and the semiconductor layer and electrically connected to the first conductive member,
a first gate pad located between the first conductive member and the semiconductor layer,
a second gate pad located between the first conductive member and the semiconductor layer, and
a second electrode located between the semiconductor layer and the second conductive member and electrically connected to the second conductive member,
the plurality of terminals include:
a first gate terminal electrically connected to the first gate pad via the interconnection member,
a second gate terminal electrically connected to the second gate pad via the interconnection member, and
a sense terminal electrically connected to the first conductive member via the interconnection member, and
the sense terminal is located between the first gate terminal and the second gate terminal in a plan view perpendicular to the first direction.

2. The semiconductor device according to claim 1, wherein
the interconnection member includes
a first interconnection layer electrically connected to the first gate terminal,
a second interconnection layer electrically connected to the second gate terminal, and
a third interconnection layer electrically connected to the sense terminal.

3. The semiconductor device according to claim 2, wherein the third interconnection layer is located between the first interconnection layer and the second interconnection layer in the first direction.

4. A semiconductor device comprising:
a first conductive member;
a second conductive member;
an interconnection member located between the first conductive member and the second conductive member;
a plurality of semiconductor chips located between the second conductive member and the interconnection member in a first direction from the first conductive member to the second conductive member; and
a plurality of terminals extending from the interconnection member in a direction intersecting the first direction,
one semiconductor chip of the plurality of semiconductor chips including:
a semiconductor layer,
a first electrode located between the first conductive member and the semiconductor layer and electrically connected to the first conductive member,
a first gate pad located between the first conductive member and the semiconductor layer,
a second gate pad located between the first conductive member and the semiconductor layer, and
a second electrode located between the semiconductor layer and the second conductive member and electrically connected to the second conductive member,
the plurality of terminals include:
a first gate terminal electrically connected to the first gate pad via the interconnection member,
a second gate terminal electrically connected to the second gate pad via the interconnection member,
a first sense terminal electrically connected to the first conductive member via the interconnection member, and
a second sense terminal electrically connected to the first conductive member via the interconnection member, and
in a plan view perpendicular to the first direction, the first sense terminal is located adjacent to the first gate terminal, and the second sense terminal is located adjacent to the second gate terminal.

5. The semiconductor device according to claim 4, wherein
the first sense terminal and the second sense terminal are located between the first gate terminal and the second gate terminal in the plan view.

6. The semiconductor device according to claim 4, wherein
in the plan view, when a straight line passing through a position having an equal distance from the first gate terminal and the first sense terminal between the first gate terminal and the first sense terminal is defined as a first imaginary line, and a straight line passing through a position having an equal distance from the second gate terminal and the second sense terminal between the second gate terminal and the second sense terminal is defined as a second imaginary line, an angle formed by the first imaginary line and the second imaginary line is 45° or more and 135° or less.

7. The semiconductor device according to claim 4, wherein
the interconnection member includes
a first interconnection layer electrically connected to the first gate terminal, a second interconnection layer electrically connected to the second gate terminal, and a third interconnection layer electrically connected to the first sense terminal and the second sense terminal.

8. The semiconductor device according to claim 7, wherein the third interconnection layer is located between the first interconnection layer and the second interconnection layer in the first direction.

9. The semiconductor device according to claim 1, wherein a difference between a distance between the first gate terminal and the sense terminal and a distance between the second gate terminal and the sense terminal is 0 mm or more and 15 mm or less.

10. The semiconductor device according to claim 4, wherein a difference between a distance between the first gate terminal and the first sense terminal and a distance between the second gate terminal and the second sense terminal is 0 mm or more and 15 mm or less.

11. The semiconductor device according to claim 6, wherein the angle formed by the first imaginary line and the second imaginary line is 75° or more and 105° or less.

* * * * *